United States Patent
Culp et al.

(10) Patent No.: US 7,627,836 B2
(45) Date of Patent: Dec. 1, 2009

(54) OPC TRIMMING FOR PERFORMANCE

(75) Inventors: James A. Culp, Downington, PA (US); Lars W. Liebmann, Poughquag, NY (US); Rajeev Malik, Pleasantville, NY (US); K. Paul Muller, Wappingers Falls, NY (US); Shreesh Narasimha, Beacon, NY (US); Stephen L. Runyon, Pflugerville, TX (US); Patrick M. Williams, Salt Point, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/164,044

(22) Filed: Nov. 8, 2005

(65) Prior Publication Data

US 2007/0106968 A1    May 10, 2007

(51) Int. Cl.
    *G06F 17/50*    (2006.01)
(52) U.S. Cl. .................................. 716/2; 716/6; 716/21
(58) Field of Classification Search ............... 716/2, 716/19, 21, 6
    See application file for complete search history.

(56) References Cited

U.S. PATENT DOCUMENTS

| | | | | |
|---|---|---|---|---|
| 5,521,837 | A * | 5/1996 | Frankle et al. | 716/10 |
| 6,205,570 | B1 | 3/2001 | Yamashita | |
| 6,578,179 | B2 | 6/2003 | Shirotori et al. | |
| 6,691,285 | B1 | 2/2004 | Burden et al. | |
| 6,711,720 | B2 | 3/2004 | Chen | |
| 6,789,248 | B1 * | 9/2004 | Lu et al. | 716/18 |
| 6,845,494 | B2 * | 1/2005 | Burks et al. | 716/6 |
| 6,928,635 | B2 * | 8/2005 | Pramanik et al. | 716/21 |
| 2003/0233628 | A1 | 12/2003 | Rana et al. | |
| 2004/0103377 | A1 | 5/2004 | Eaton et al. | |
| 2004/0230924 | A1 | 11/2004 | Williams et al. | |
| 2005/0022141 | A1 | 1/2005 | Walker et al. | |

OTHER PUBLICATIONS

Kiran Puttaswamy, Kyu-Won Choi, Jun Cheol Park, Vincent J. Mooney III, Abhijit Chatterjee and Peeter Ellervee: "System Level Power-Performance Trade-Offs in Embedded Systems Using Voltage and Frequency Scaling of Off-Chip Buses and Memory." ISSS'02, Oct. 2 thru Oct. 4, 2002, Kyoto, Japan; 6 Pages.

(Continued)

*Primary Examiner*—Paul Dinh
*Assistant Examiner*—Patrick Sandoval
(74) *Attorney, Agent, or Firm*—DeLio & Peterson, LLC; Robert Curcio; Wenjie Li

(57) ABSTRACT

An iterative timing analysis is analytically performed before a chip is fabricated, based on a methodology using optical proximity correction techniques for shortening the gate lengths and adjusting metal line widths and proximity distances of critical time sensitive devices. The additional mask is used as a selective trim to form shortened gate lengths or wider metal lines for the selected, predetermined transistors, affecting the threshold voltages and the RC time constants of the selected devices. Marker shapes identify a predetermined subgroup of circuitry that constitutes the devices in the critical timing path. The analysis methodology is repeated as often as needed to improve the timing of the circuit with shortened designed gate lengths and modified RC timing constants until manufacturing limits are reached. A mask is made for the selected critical devices using OPC techniques.

7 Claims, 5 Drawing Sheets

OTHER PUBLICATIONS

Diana Marculescu, Anoop Iyer—Dept. of Electrical & Computer Engineering; "Application-Driven Processor Design Exploration For Power-Performance Trade-Off Analysis" Computer Aided Design, 2001, ICCAD 2001, IEEE/ACM International Conference Publication Date: 2001—Meeting Date: Nov. 4, 2001-Nov. 6, 2001; Location: San Jose, CA, USA pp. 306-313.

* cited by examiner

OPC TRIMMING FOR PERFORMANCE

BACKGROUND OF THE INVENTION

1. Field of the Invention

The present invention relates to semiconductor wafer processing, particularly to the enhancement of chip yield, performance, and timing. More particularly, the present invention relates to a methodology for modifying selected devices that affect the critical timing of the chip and developing a mask for optically trimming the gate lengths of the devices within the critical path.

2. Description of Related Art

Optical Proximity Correction (OPC) is required when a different printing of a first feature occurs because a second feature is in close proximity to the first feature. The proximity of the second feature plays a role in altering the printing image of the first feature. In order to compensate for the impact coming from the closeness of other features, proximity features are adjusted in terms of their line width and length, particularly at the gate level.

Devices in a circuit's critical path need to be strengthened individually or as a subgroup in order to optimize timing. Overexposure or reactive ion etch trim of gates cannot address the need for strengthening individual devices or subgroups since the entire chip or wafer is affected by these processes. Strengthening the devices by lowering the threshold voltage is typically considered a granular remedy resulting in a threshold voltage step function with steps that are often too few and too large. Moreover, in most instances, the remedy of lowering the threshold voltages may have already been chosen, thus representing an exhausted option. Additionally, lowered threshold voltages will cause the off-state leakage current to increase dramatically. Adding an additional mask for a selective polysilicon trim (PT) would allow for only one step, and would not allow for fine tuning the design. Furthermore, a part which is printed three-sigma short would have non-critical devices contributing substantially to the quiescent power supply current or standby current ($I_{ddq}$) of the device under test. FIG. 1 depicts a graph of measured standby current ($I_{ddq}$) data versus ring oscillator speed. As depicted in quadrant A, the higher the $I_{ddq}$, the faster the ring oscillator speed. Quadrant C shows the opposite result: the lower the $I_{ddq}$, the slower the ring oscillator.

In order to obtain higher performance and faster integrated circuit chip speeds, the gates are generally given a higher lithographic dose enabling them to be printed with a shorter gate length in terms of power flow. The gate length is commonly referred to as L-poly. In order to obtain a short gate length or short L-poly, the lithographic dose is increased in a non-isolated manner, making all gate lengths short, and yielding faster speeds for all chips simultaneously. However, in this scenario, the active or ON currents increase linearly with the shorter gate length, while the passive or OFF currents increase exponentially. Moreover, the switching speed of the chip continues to increase. These effects may lead to an operating situation where the chip exceeds its thermal cooling capacity.

FIG. 2 graphically depicts units meeting various specifications with respect to ring oscillator and standby current combinations. Below each horizontal line and to the left of each vertical line are units that meet predetermined specifications. The units that are either too slow or have too much leakage current are those above the horizontal lines and/or to the right of the vertical lines. These devices have a standby current that is unacceptably high, and may represent a majority of the yield. The higher the standby current, the more likely the devices will exceed their thermal cooling capacity.

In U.S. Pat. No. 6,205,570 issued to Yamashita on Mar. 20, 2002, entitled "METHOD FOR DESIGNING LSI CIRCUIT PATTERN", an LSI circuit pattern that connects gates on an LSI chip is designed by estimating a chip area and the number of gates required for achieving a desired function, and determining the proper interconnect length of each of the gates. A wiring pattern is devised from these estimations. Importantly, Yamashita teaches a methodology for deriving the length of an interconnect line between gates, for example, a BEOL metallization between a first gate and a second gate. Yamashita does not derive a reduction for individual gate length within a gate.

Consequently, rather than increasing the lithographic dosage, which prints all gates short and presents a high standby current ($I_{ddq}$), there is a need in the art to provide a technique for printing only selective circuits and individual gates short, so that the standby current remains at an acceptable level. In the present invention, optical proximity correction is used as a method for designing integrated circuits, and to intentionally modify the gate length of specific devices for performance enhancement reasons, or to intentionally modify the line width of a metallization wire for RC reduction purposes, or both. This is done in addition to the conventional correction of optical proximity effects.

SUMMARY OF THE INVENTION

Bearing in mind the problems and deficiencies of the prior art, it is therefore an object of the present invention to provide a methodology for improving integrated circuit yield, performance, and timing.

It is another object of the present invention to provide an analytical method for improving the switching time of integrated circuit chip design.

A further object of the invention is to provide a higher performance and faster integrated circuit chip speed using gates that are generally given a higher lithographic dose and having a shorter gate length in terms of power flow.

It is yet another object of the present invention to provide a method for printing only selective circuits short in an integrated circuit chip, so that standby currents remain at an acceptable level.

Still other objects and advantages of the invention will in part be obvious and will in part be apparent from the specification.

The above and other objects, which will be apparent to those skilled in the art, are achieved in the present invention, which is directed to a method for optimizing an integrated circuit chip comprising: identifying timing sensitive devices that are within the critical timing path of the integrated circuit chip; and generating a mask to shorten gate lengths of each of the timing sensitive devices without shortening the gate lengths of devices that are not within the critical timing path. The method includes using optical proximity correction (OPC) techniques to generate the mask. A PT mask is analytically designed to shorten each of the gate lengths of the timing sensitive circuits only, without shortening the gate lengths of devices that are not within the critical timing path. Additionally, time sensitive devices may be analytically determined in the integrated circuit chip; marker shapes analytically applied to identify and locate the timing sensitive devices; and assigned shortened gate lengths applied to each of the timing sensitive devices. The method may also include the steps of generating a set of timing rules for the integrated circuit chip including the timing sensitive devices; comparing the set of timing rules to predetermined product requirements; shortening each of the gate lengths of the timing sensitive devices an incremental amount if the product requirements are not met by the set timing rules; and repeating the steps of comparing timing rules to product requirements and shortening the gate lengths until the product requirements are met. Furthermore, optimization data including gate lengths of the timing sensitive devices may be obtained when the product requirements are met; and a mask generated from the optimization data. The set of timing rules may then be compared to manufacturing limits and the mask may be generated from data less optimized than the optimization data when the manufacturing limits are reached or exceeded prior to obtaining design optimization. The step of generating the mask to shorten the gate lengths of each of the timing sensitive devices may include lowering threshold voltages for each of the timing sensitive devices.

In a second aspect, the present invention is directed to a method for optimizing an integrated circuit chip comprising: identifying timing sensitive devices that are within a critical timing path of the integrated circuit chip; and generating a mask to modify RC time constants of the timing sensitive devices without modifying the RC time constants of devices that are not within the critical timing path. This method may comprise: analytically determining the timing sensitive devices in the integrated circuit chip; analytically applying marker shapes to identify and locate the timing sensitive devices; and adjusting metal line widths and proximity distances for each of the timing sensitive devices to modify resistor and capacitor components of the RC time constants.

In a third aspect, the present invention is directed to a method for optimizing an integrated circuit chip comprising: analytically determining timing sensitive devices in the integrated circuit chip; analytically applying marker shapes to locate and identify the timing sensitive devices; assigning gate lengths to each of the timing sensitive devices; generating a set of timing rules for the integrated circuit chip including the timing sensitive devices; comparing the set of timing rules to product requirements; shortening the gate lengths of each of the timing sensitive devices an incremental amount if the product requirements are not met by the first set timing rules; repeating the steps of comparing timing rules to product requirements and shortening the gate lengths further until the product requirements are met; obtaining optimization data when the product requirements are met; and generating a mask from the optimization data using optical proximity correction techniques. The method further includes generating the mask to modify RC time constants of the timing sensitive devices without modifying the RC time constants of devices that are not within the critical timing path.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
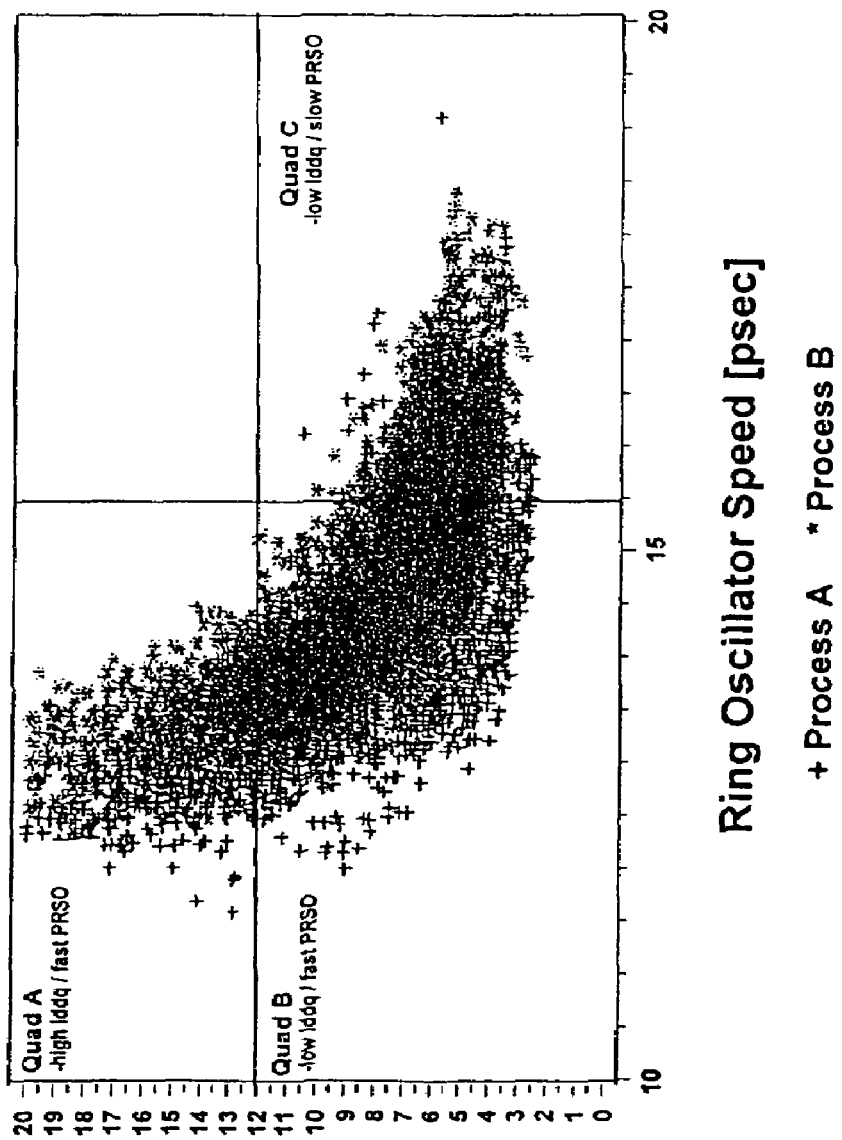
FIG. 1 depicts a graph of measured standby current ($I_{ddq}$) data versus ring oscillator speed.
Figure 2:
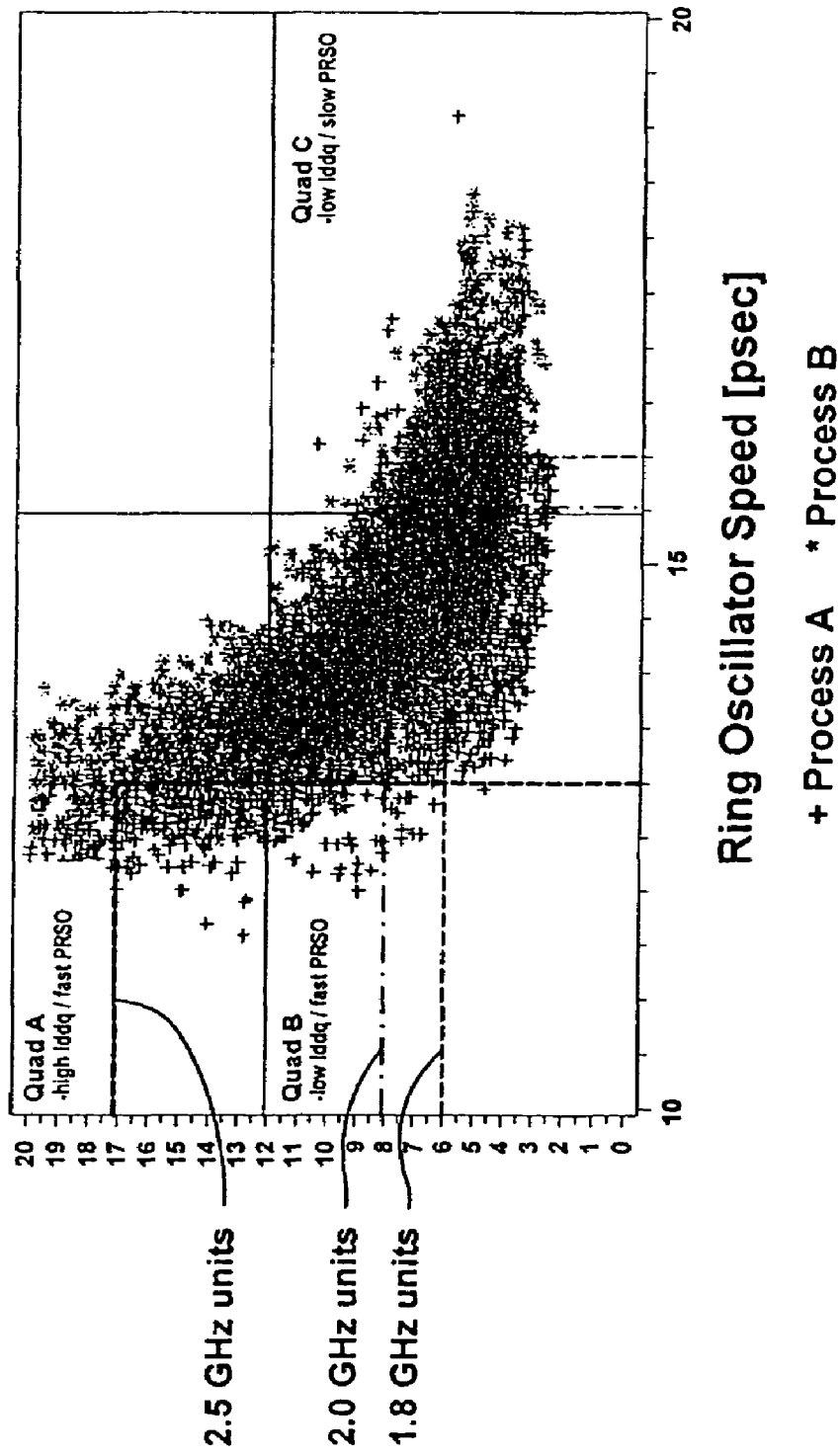
FIG. 2 graphically depicts units meeting specifications for various ring oscillator speeds as a function of the standby current.

In describing the preferred embodiment of the present invention, reference will be made herein to FIGS. 1-5 of the drawings in which like numerals refer to like features of the invention.

The present invention teaches the selection of certain critical, performance limiting circuits and improves overall chip performance by addressing the performance shortcomings of those selected circuits through L-poly reduction or RC optimization or both. It does not attempt to increase the lithographic dose applied to the whole chip, which would print all the gate lengths short and substantially increase the standby current, $I_{ddq}$.

Generally, each chip constitutes a plurality of circuits having a number of different uses, but in terms of timing, only a few of the circuits are in defined critical paths. Typically, no more than a subset of the plurality of circuits is selected as being in the critical path. These circuits represent devices having signal propagation that if too slow would affect the speed of the entire chip. This is typically a very small percentage of the whole circuitry of the chip, on the order of 2% to 10% of the chip's devices.

A timing analysis is analytically performed before a chip is fabricated, usually during the software development stage or during chip design. In this manner the selection of circuits and devices in the critical path may be predetermined. If a device is in the critical path and needs to be strengthened individually or as part of a subgroup in order to optimize timing, it will need to be made faster and strengthened independent of the non-critical devices that surround it.

As discussed, overexposure of all gates cannot address the need for strengthening individual devices or subgroups. Discrete devices cannot selectively be chosen by an overexposure method. Additionally, reactive ion edge trim, which is another method of obtaining a shorter gate length, may be a less desirable alternative because it also affects all the devices on the chip. If applied, reactive ion edge trim would effectively trim the entire wafer short. Both, overexposure of all gate and reactive ion etch trim, have the major drawback of greatly increasing device off-state leakage current and thus chip power.

In a first embodiment, the present invention introduces a methodology for shortening L-poly, or trimming the gate lengths, for the devices in the critical path. This enables the transistors to switch ON at an earlier stage, and effectively lowers the device threshold voltage. The threshold voltage defines where each device approaches the conducting regime. If the threshold voltage is indeed lower, the transistor switches ON at an earlier time. For example, in an inverter stage, the inversion of the signal would be performed at an earlier time.

Shorting the L-poly of selected devices in the critical path makes each transistor switch faster. However, even though the switching speed is enhanced there remains the expected drawback, namely, with a lower threshold voltage, $V_T$, comes an increase in leakage current for all the affected devices. In this manner, the devices that are not supposed to be conducting will generally leak more current, which cumulatively adds and yields higher $I_{ddq}$ components. Moreover, adjusting the threshold voltage is to a large degree granular. Usually a nominal $V_T$ is specified, and the process of lowering the threshold voltage value is performed in a single operation that does not allow for multiple decrements in fine, discrete steps.

The present invention proposes to the shorten L-poly by means of optical proximity correction (OPC) by forming a selective trim in a similar direction as the lithography overexposure, but in a mask fashion so that it combines to form a shortened L-poly and a lowered threshold voltage for selected transistors only. The additional mask allows for an overexposure of a subsection of the chip, particularly an overexposure of critical devices on the chip. In order to perform this task, an additional lithographic mask is employed to add resist components that effectively trim down the transistor gates. The result yields selected predetermined gates with shorter lengths.

In terms of the solution, it is desirable to test the strength of each subgroup of critical devices without affecting or physically touching other non-critical devices. Analytical marker shapes are applied in the design to mark the critical path devices. In circuits that have a ratio of nFETS and pFETS, the markers may be applied differently for the different types of transistors. The markers identify the critical path devices. The marker shapes are in the analytically formed design space where the active area, gate conductor, and contacts are drawn. Consequently, in addition to the known levels for active area, gate conductor, contact, and metallization, an additional level is introduced which is solely dedicated to marking a specific subgroup of critical gates. Preferably, the marking is performed by software instructions.

A subset of the circuitry is analytically highlighted with marker shapes during processing. The marker shapes identify a predetermined subgroup of circuitry that constitutes the devices in the critical timing path. The device modeling is then extended towards shorter L-poly or shorter gate lengths, that includes a variety of shortening approaches, many of which are already in the device software models covering a broad range of L-poly regimes. Importantly, the device model reflects the properly short L-poly sought in the timing model. Shorter L-poly improves the switching speed.

This analysis methodology is then repeated as often as needed to improve the timing shortened designed L-poly for the marked devices. Once the shape of the design is marked analytically for the critical path devices, preferably by software algorithm, the desired shortening of the L-poly is analytically applied to the marked devices, and a timing analysis is executed to confirm performance. Following the analysis, a complete timing/sensitivity run is executed to ensure correct recognition of the marked devices and their subsequent altered switching speeds. New timing rules are then generated. After timing optimization is completed, the optimized L-poly data is inputted within OPC data preparation algorithms and a first PC mask is generated.

Figure 3:
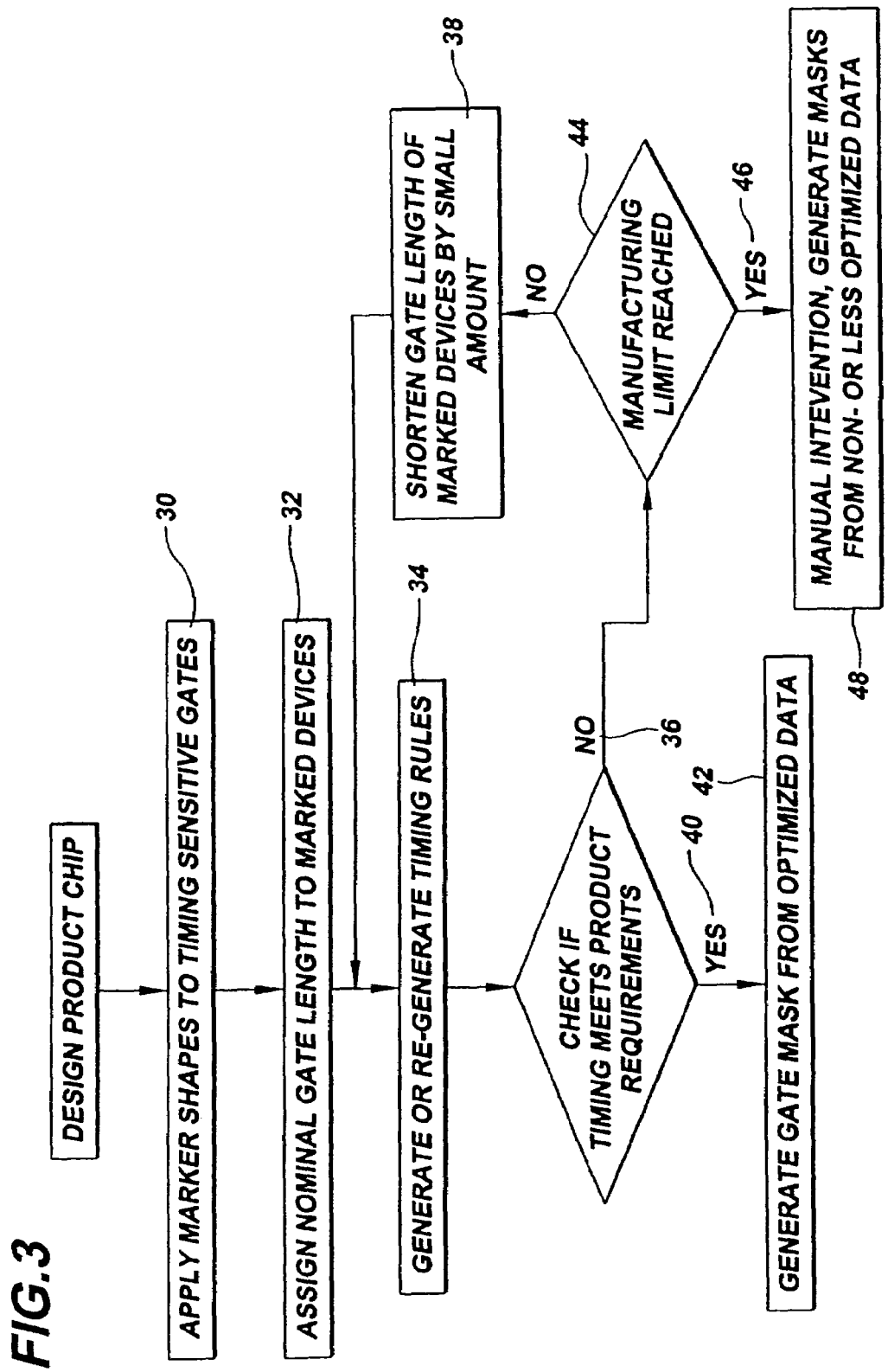
FIG. 3 depicts the process flow of the methodology of the present invention for designing a product chip.

FIG. 3 depicts the process flow of the methodology of the present invention for designing a product chip with trimming using OPC. Timing sensitive gates are identified and marker shapes are applied to identify these gates 30. Nominal gate lengths are assigned for each marked device 32. Timing rules are then (re)generated 34. This is preferably accomplished by running a separate software tool that evaluates the chip's overall timing, and in particular, investigates how the marked regions for the timing critical parts interact and affect the overall timing, ensures desired timing goals are met for the product requirements, and verifies that the product works properly. If the product timing requirements are not met 36, and the manufacturing limits are not exceeded 44, the gate lengths are analytically shortened an incremental amount 38, and new timing rules are regenerated 34. If the product timing requirements are met 40, a gate mask is generated from the optimized data 42. In the event that the new timing does not meet the product's requirements, a screen-check of the manufacturing limits is made to ensure that these limits have not been breached 44. If the manufacturing limits have not been exceeded, gate lengths are again shortened 38, and new timing rules are generated or simulated 34. If the modified design reaches the manufacturing limits 46, a manual intervention is preferably required 48, which defaults to a generated mask from a less optimized design, or in the event there is no such optimization, from a non-optimized design.

In a second embodiment, the RC time constants of devices in the time-sensitive critical path are adjusted, directly altering the switching times for the critical devices. The iterative methodology employed to shorten the L-poly using OPC trimming may also be applied to adjust metal lines that form resistive paths, and to adjust the parasitic capacitance coupling among device neighbors.

Figure 4:
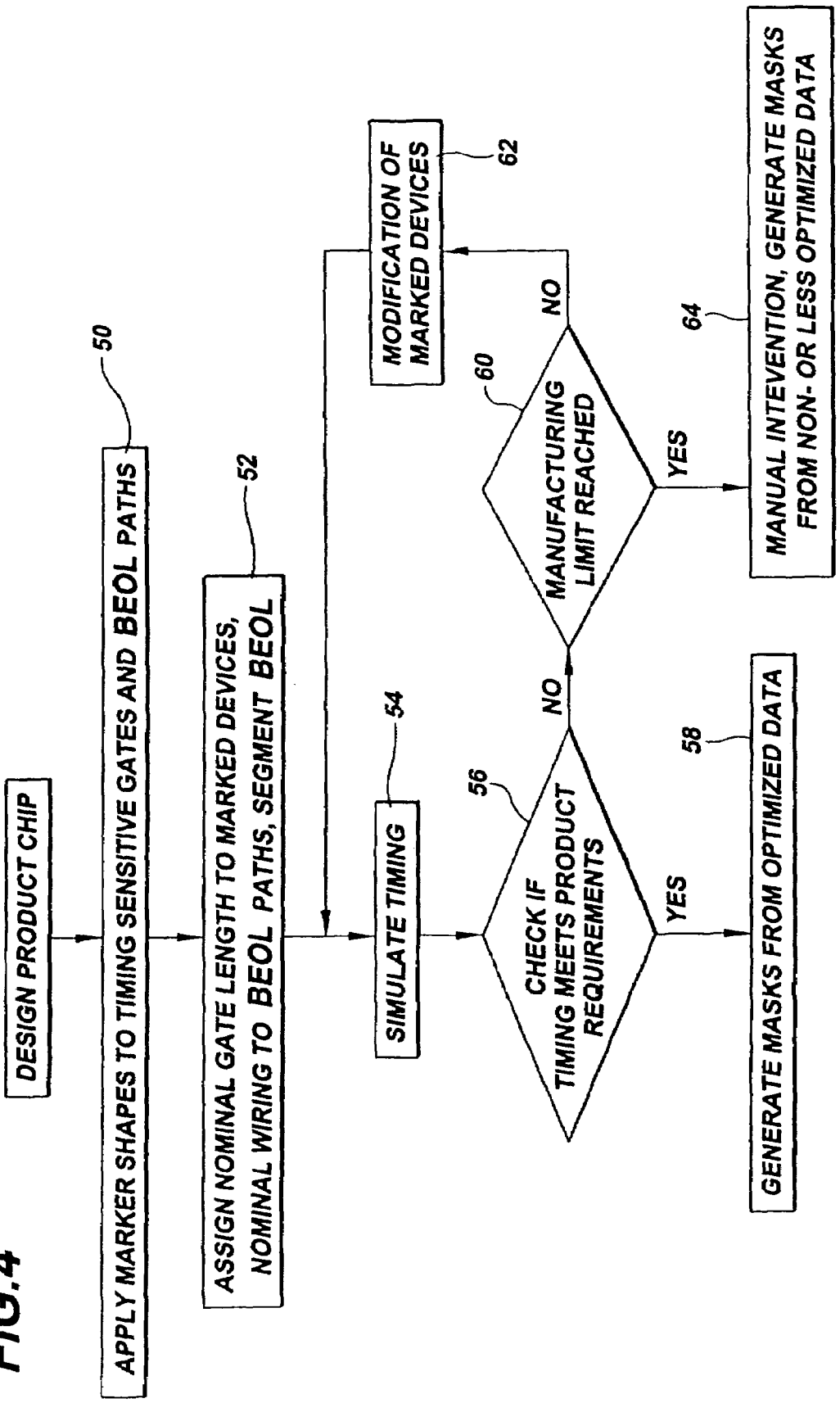
FIG. 4 depicts the process flow of the methodology of the present invention for design a product chip for Front End-of-Line (FEOL) processing using the OPC trimming technique of the present invention.

FIG. 4 depicts the process flow of the methodology of the present invention for design a product chip for Front End-of-Line (FEOL) processing using the OPC trimming technique of the present invention. First, marker shapes are analytically applied to timing sensitive gates and BEOL paths 50. Normally, BEOL begins as the first contact for all metallization layers. BEOL suffers from RC delay due to long line lengths and next-neighbors. The resistance (R) may be improved by making the metallization line wider; however, this creates capacitive (C) issues. Nominal gate lengths are assigned to the marked devices; nominal wiring is assigned to BEOL paths; and the BEOL paths are segmented 52. The timing is then simulated 54 preferably by running a separate software tool that evaluates the chip's overall timing. Timing values are investigated to see if they meet product requirements 56. If the new timing meets product requirements, masks are generated from the optimized data 58. If the new timing does not meet the product's requirements, a screen-check of the manufacturing limits is made to ensure that these limits have not been breached 60. If the manufacturing limits have not been exceeded, the marked devices are modified 62, and new timing rules are generated or simulated 54. The RC delay of the BEOL is reduced through wiring modifications, including changing the width of the segments and adding redundant contacts and vias. If manufacturing limits have been met, a manual intervention is required 64 which defaults to a generated mask from the less optimized design, or in the event there is no such optimization, from a non-optimized design.

Figure 5:
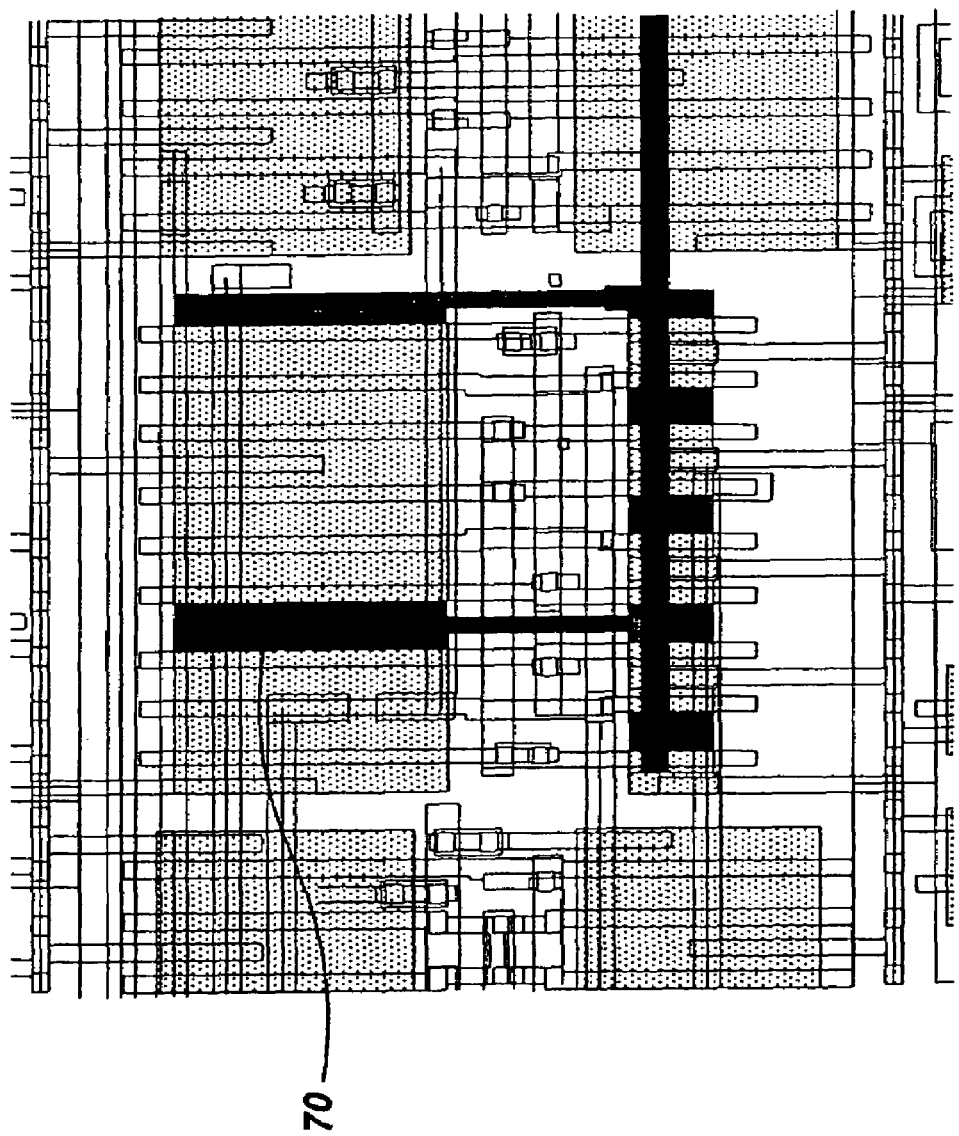
FIG. 5 is a schematic representation of a subset of circuitry marked for OPC trimming for performance enhancement.

FIG. 5 is a schematic representation of a subset of circuitry marked for OPC trimming for performance enhancement. Highlighted segments 70 are shown locating the critical device subgroup that will be subject to additional trimming for gate shortening. Analytically applied Markers have identified this subgroup as being within the critical timing path.

The present invention provides a technology boost to the development of semiconductor devices without having to undergo a full development cycle. It gives the developer the ability to design the fast devices only where they are needed to enhance the overall circuit's timing requirements. With no need to drive the entire chip towards short L-poly, high performance may be combined with nominal power consumption, and result in high yields early in the product cycle. The present invention also allows for easy n/p beta ratio adjustments. Importantly, the polysilicon trim mask approach (PT) is replaced with a cost effective analytically derived process.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A method for optimizing an integrated circuit chip comprising:
    identifying timing sensitive devices that are within a critical timing path of said integrated circuit chip;
    generating by using optical proximity correction (OPC) techniques that run on a computer system, an additional mask for a lithography overexposure of a subsection of said integrated circuit chip to shorten gate lengths of each of said timing sensitive devices without shortening gate lengths of devices that are not within the critical timing path by forming a selective trim in a similar direction as said lithography overexposure; and
    generating a first set of timing rules for said integrated circuit chip including said timing sensitive devices;
    comparing said first set of timing rules to predetermined product requirements;
    shortening each of said gate lengths of said timing sensitive devices an incremental amount if said predetermined product requirements are not met by said first set of timing rules;
    regenerating a subsequent set of timing rules based on the shortening of each of said gate lengths of said timing sensitive devices; and
    repeating steps of comparing said subsequent set of timing rules to predetermined product requirements and regenerating timing rules and shortening said gate lengths until said predetermined product requirements are met.

2. The method of claim 1 including using a polysilicon trim (PT) mask analytically designed to shorten each of said gate lengths of said timing sensitive circuits only, without shortening the gate lengths of devices that are not within the critical timing path.

3. The method of claim 1 including:
    analytically determining said timing sensitive devices in said integrated circuit chip;
    analytically applying marker shapes to identify and locate said timing sensitive devices; and
    assigning shortened gate lengths to each of said timing sensitive devices.

4. The method of claim 1 including:
    obtaining optimization data including gate lengths of said timing sensitive devices when said product requirements are met; and
    generating said mask from said optimization data.

5. The method of claim 4 further including comparing said set of timing rules to manufacturing limits and generating said mask from data less optimized than said optimization data when said manufacturing limits are reached or exceeded prior to obtaining design optimization.

6. The method of claim 1 wherein said step of generating timing rules includes inputting results of a separate timing software analysis tool modeling the timing of said timing sensitive devices having shortened gate lengths.

7. The method of claim 1 wherein said step of generating said mask to shorten said gate lengths of each of said timing sensitive devices includes lowering threshold voltages for each of said timing sensitive devices.

* * * * *